(12) United States Patent
Khalili Amiri et al.

(10) Patent No.: US 9,537,087 B2
(45) Date of Patent: Jan. 3, 2017

(54) MAGNETORESISTANCE SENSOR WITH PERPENDICULAR ANISOTROPY

(71) Applicant: THE REGENTS OF THE UNIVERSITY OF CALIFORNIA, Oakland, CA (US)

(72) Inventors: Pedram Khalili Amiri, Los Angeles, CA (US); Zhongming Zeng, Suzhou (CN); Kang L. Wang, Santa Monica, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 14/606,206

(22) Filed: Jan. 27, 2015

(65) Prior Publication Data
US 2015/0137292 A1    May 21, 2015

Related U.S. Application Data

(63) Continuation of application No. PCT/US2013/053996, filed on Aug. 7, 2013.

(60) Provisional application No. 61/680,579, filed on Aug. 7, 2012.

(51) Int. Cl.
| | |
|---|---|
| *H01L 43/08* | (2006.01) |
| *G01R 33/09* | (2006.01) |
| *H01L 43/10* | (2006.01) |

(52) U.S. Cl.
CPC .............. *H01L 43/08* (2013.01); *G01R 33/098* (2013.01); *H01L 43/10* (2013.01)

(58) Field of Classification Search
CPC .......................................... H01L 43/08–43/10

USPC ........................................................ 257/421
See application file for complete search history.

(56) References Cited

U.S. PATENT DOCUMENTS

| | | | |
|---|---|---|---|
| 2009/0091864 A1 | 4/2009 | Carey et al. | |
| 2009/0229111 A1* | 9/2009 | Zhao ...................... | B82Y 10/00 29/603.08 |
| 2010/0007344 A1* | 1/2010 | Guo et al. ...................... | 324/260 |
| 2011/0014500 A1* | 1/2011 | Horng et al. ............... | 428/846.3 |
| 2012/0120520 A1* | 5/2012 | Childress ............... | B82Y 25/00 360/69 |
| 2012/0135273 A1* | 5/2012 | Horng .................. | C23C 14/3414 428/828.1 |

(Continued)

FOREIGN PATENT DOCUMENTS

| | | |
|---|---|---|
| WO | 2012/082998 A1 | 6/2012 |
| WO | 2014/025914 A1 | 2/2014 |

OTHER PUBLICATIONS

Korean Intellectual Property Office (KIPO), International Search Report and Written Opinion, issued on Nov. 15, 2013, for corresponding International Patent Application No. PCT US2013/053996 (pp. 1-14) and claims (pp. 14-18) pp. 1-18.

*Primary Examiner* — Christine Enad
(74) *Attorney, Agent, or Firm* — John P. O'Banion

(57) ABSTRACT

A nanoscale tunnel magneto-resistance (TMR) sensor comprising an in-plane-magnetized reference layer and a free layer comprising interfacial perpendicular anisotropy, wherein the free layer comprises a sensing layer for sensing resistance as a function of applied magnetic field and is tunable to vary the direction of the sensing layer magnetization to be in-plane, canted, or out-of-plane.

29 Claims, 6 Drawing Sheets

(56) References Cited

U.S. PATENT DOCUMENTS

| | | | |
|---|---|---|---|
| 2012/0313192 A1* | 12/2012 | Bandiera | G11C 11/161 257/421 |
| 2013/0113478 A1* | 5/2013 | Pant | 324/252 |
| 2014/0008742 A1* | 1/2014 | Chen | G01R 33/098 257/421 |
| 2014/0038309 A1* | 2/2014 | Abraham et al. | 438/3 |
| 2014/0177327 A1* | 6/2014 | Khalili Amiri | G11C 11/161 365/158 |

* cited by examiner

MAGNETORESISTANCE SENSOR WITH PERPENDICULAR ANISOTROPY

CROSS-REFERENCE TO RELATED APPLICATIONS

This application is a 35 U.S.C. §111(a) continuation of PCT international application number PCT/US2013/053996 filed on Aug. 7, 2013 and incorporated herein by reference in its entirety, which claims priority to, and the benefit of, U.S. provisional patent application Ser. No. 61/680,579 filed on Aug. 7, 2012 and incorporated herein by reference in its entirety. Priority is claimed to each of the foregoing applications.

The above-referenced PCT international application was published as PCT International Publication No. WO 2014/025914 on Feb. 13, 2014, which publication is incorporated herein by reference in its entirety.

STATEMENT REGARDING FEDERALLY SPONSORED RESEARCH OR DEVELOPMENT

This invention was made with Government support under Grant Number HR0011-10-C-0153, awarded by the U.S. Department of Defense, Defense Advanced Research Projects Agency. The Government has certain rights in the invention.

INCORPORATION-BY-REFERENCE OF MATERIAL SUBMITTED IN A COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND

1. Technical Field

This technology pertains generally to magneto-resistance (MR) sensors, and more particularly to magneto-resistance (MR) sensors which may incorporate spin valve or magnetic tunnel junction (MTJ) devices.

2. Background Discussion

Magneto-resistance (MR) sensors based on spin valve and magnetic tunnel junction (MTJ) devices have been widely used in applications such as magnetic field sensors, position and rotation sensors, as well as medical applications because of their large signal, low power consumption, and long endurance.

In magnetic sensors, the central issue is the linear and reversible response to the magnetic field. At present, one popular method is to align the magnetizations of a sensing layer and a reference layer to be initially perpendicular to each other in the plane of the film. This can be obtained by introducing an external or internal transverse bias field, or by utilizing shape anisotropy and step edge anisotropy. However, such designs complicate sensor design, and suffer from magnetization fluctuation and magnetic noise when reducing sensor size. This limits the scalability and integration for applications.

Another approach employs out-of-plane magnetized materials to achieve a linear and hysteresis-free response. For example, linear response and large linear field range have been obtained in sensors with a perpendicularly magnetized reference layer and in-plane sensing layer. A sensor with a high linearity up to applied field of 500 Oe has been demonstrated by using Pt/CoFe out-of-plane magnetized sensing layer. However, multilayer-based structures using transition metals such as Pt- and Pd-multilayer structures exhibit small MR due to their low spin polarization, further resulting in low sensitivity.

BRIEF SUMMARY

An aspect of the technology described herein is a nanoscale linear magnetoresistance sensor with an in-plane magnetized reference layer and a sensing layer with interfacial perpendicular anisotropy. The sensor exhibits high TMR and a tunable free layer magnetization (e.g. magnetization direction tunable to be in-plane, canted, or out-of-plane), which leads to high sensitivity and linearity. The sensor exhibits a large field sensitivity (demonstrated up to 0.02%/Oe) and a high linear field range (demonstrated up to 600 Oe). It is appreciated that actual sensitivity and linear field range values may exceed those demonstrated.

The technology described herein incorporates CoFeB materials with perpendicular magnetic anisotropy for MgO based devices such as spin valve and magnetic tunnel junction (MTJ) devices in magnetic field sensors including speed, position and rotation sensors (e.g. used for the automotive industry), hard disk drive read heads, medical applications, etc.

The sensors of the technology described herein exhibit high MR value (typically larger than ~10%) and large interfacial perpendicular anisotropy (IPA) (typically larger than $0.2 \text{ mJ/m}^2$). The utilization of CoFeB with large IPA for building sensors produces high sensitivity due to its high MR ratio when used in MgO based MTJ structures.

Another aspect is a nanoscale MTJ sensor with a CoFeB sensing layer that exhibits perpendicular anisotropy. A unique material structure and device design are used to realize a superior sensor with an out-of-plane magnetization free layer (or partially in-plane free layer with perpendicular anisotropy) and in-plane reference layer. Interfacial anisotropy is used in layered material structures based on dielectric oxides (e.g. MgO) and metallic ferromagnets (e.g. Fe-rich CoFeB such as $Co_{40}Fe_{40}B_{20}$ or $Co_{20}Fe_{60}B_{20}$). The use of the interfacial anisotropy allows for simultaneous realization of high perpendicular anisotropy (hence a very linear sensor response) and a high magnetoresistance ratio (hence a high sensitivity in the sensor), achieving overall superior performance to the state of the art.

Additionally, the interfacial anisotropy (and hence the sensor response in terms of sensitivity and linearity) of the sensor of the technology described herein may be tuned by application of a DC bias voltage to the device, allowing for voltage tunability of the sensor response.

In another embodiment, a very high resistance tunnel structure (for example with a thick MgO>1 nm) may be used to achieve a high-resistance sensor, which allows for ultralow power consumption due to small leakage currents.

In one aspect, the device of the technology described herein comprises a tunnel magnetoresistance (TMR) sensor with an in-plane magnetized reference layer and (partial or complete) out-of-plane magnetized free (sensing) layer, separated by a dielectric oxide (for example MgO).

In a preferred embodiment, the perpendicular anisotropy originates at the interface of the free layer with its neighboring layers, and is therefore sensitive to its thickness. The device exhibits high TMR (i.e. larger than ~10%) to achieve high sensitivity. The device linearity is sensitive to the free layer thickness, and the sensor response (sensitivity and/or linearity) can be tuned by an applied voltage, In one embodiment, the dielectric barrier may be made thick (e.g. >1 nm) to allow only for a small leakage current, allowing for low-power operation and energy-efficient voltage-controlled tuning.

In another embodiment, the free (sensing) layer material may comprise an Fe-rich metallic film such as Fe, or CoFe, or CoFeB.

In a further embodiment, the free layer may be additionally capped (or seeded) by an appropriate metal layer that may serve both as part of a measurement contact, as well as to promote the perpendicular anisotropy. Such metal layer may comprise Ta, Ru, Hf, Pt, Pd, Cu, or the like material.

In a further embodiment, the free layer may be additionally capped (or seeded) by an appropriate oxide layer that may serve both as part of a measurement contact, as well as to promote the perpendicular anisotropy or voltage control of the sensor response. Such oxide layer may comprise MgO, TaOx, HfOx, or the like material.

The TMR sensor of the technology described herein may be integrated as part of a circuit to sense its resistance as a function of applied magnetic field for various applications. It may also be included as part of a sensor array to achieve high sensitivity and directionality, or as part of one of a range of established resistance-based sensing circuits (such as a Wheatstone bridge).

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

DETAILED DESCRIPTION

Figure 1:
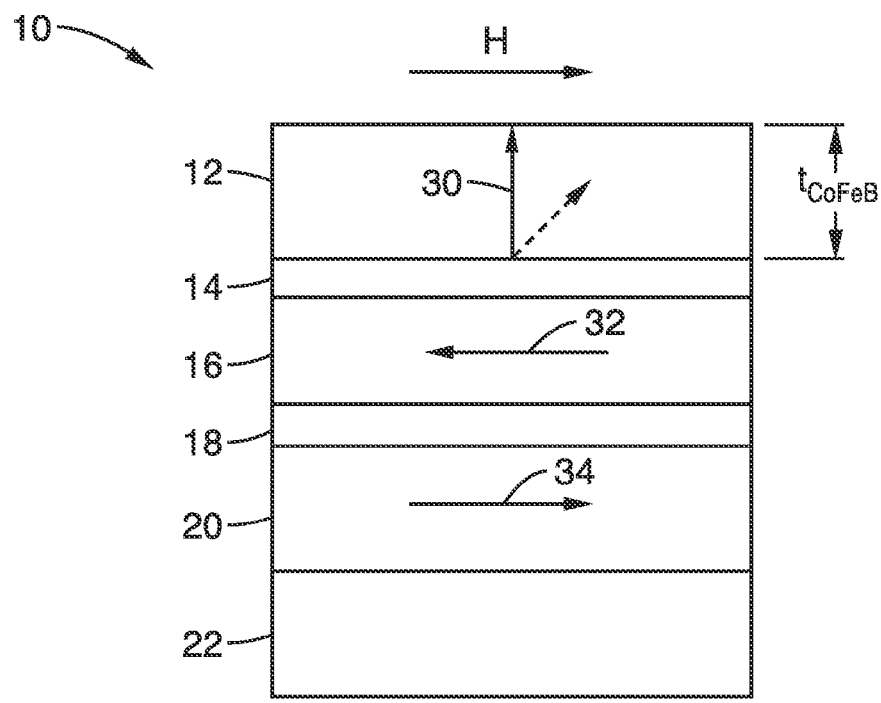
FIG. 1 is a schematic diagram of a layer structure and magnetic configuration of a magnetoresistance sensor in accordance with the technology described herein.

FIG. 1 is a schematic diagram of a layer structure 10 and magnetic configuration of a magnetoresistance sensor in accordance with the technology described herein. The sensing structure primarily comprises a free (sensing) layer 12 separated from a reference layer 16 by a dielectric barrier 14. Dielectric barrier 14 preferably comprises a dielectric oxide (e.g. MgO).

In a preferred embodiment, the reference layer 16 is part of a synthetic antiferromagnetic layer, composed of the reference layer 16, the pinned layer 20, and a spacer layer 18, where the spacer layer 18 preferably comprises a metal layer such as Ru.

In another embodiment, the reference layer 16 comprises a Co-rich layer (e.g. $Co_{60}Fe_{20}B_{20}$ or $Co_{40}Fe_{40}B_{20}$). The magnetization of the Co-rich reference layer 16 is aligned parallel to the film plane (e.g. direction 32 in FIG. 1).

In a further embodiment, the sensing (free) layer 12 comprises an Fe-rich layer such as $Co_{20}Fe_{60}B_{20}$ or $Co_{40}Fe_{40}B_{20}$. The sensing layer 12 comprises a thickness $t_{CoFeB}$ within the range of approximately 0.8 nm~2.3 nm), to allow for tuning its perpendicular anisotropy by changing the thickness of the sensing layer. In some embodiments, depending on material selection or layer configuration, the thickness may range from 1.30 nm to ~1.85 nm. Below a certain transition thickness, the magnetization (i.e. magnetic moment) direction 30 of the sensing layer 12 is perpendicular to the film plane. In this scheme, there is no need for a sensor with a large aspect ratio or external bias field, which is necessary for in-plane sensors in order to achieve linear output.

The structure 10 shown in FIG. 1 is shown in use in a magnetic tunnel junction configuration, with two ferromagnetic layers 16, 20 separated by a metallic spacer (e.g. coupling or spacer layer 18 comprising Ru). Such a configuration comprises a ferromagnetic pinned layer 20 (e.g. comprising having magnetization direction 34 opposite to magnetization direction 32 of reference layer 16). An extra anti-ferromagnetic layer 22 (e.g. PtMn or IrMn) may be included to pin the orientation of the ferromagnets. The magnetic field H to be sensed by the device is in plane for this device 10.

The dielectric barrier 14 may be made thick (e.g. >1 nm) to allow only for a small leakage current, allowing for low-power operation and energy-efficient voltage-controlled tuning.

While the free (sensing) layer 12 comprises $Co_{20}Fe_{60}B_{20}$ or $Co_{40}Fe_{40}B_{20}$ in a preferred embodiment, it is contemplated that sensing layer 12 material may comprise other Fe-rich metallic films such as Fe, or CoFe, or CoFeB.

Figure 2:
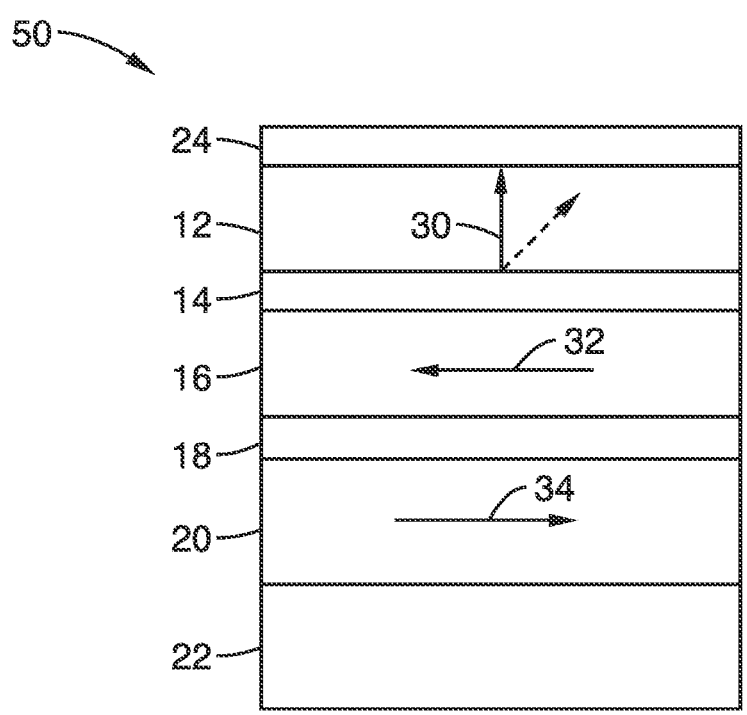
FIG. 2 is a schematic diagram of the sensor of FIG. 1 with a capping layer.
Figure 3A:
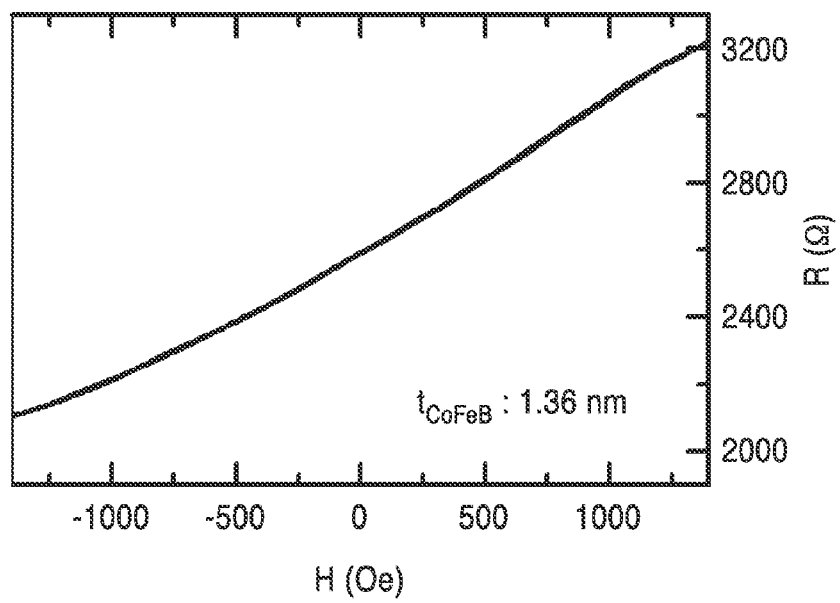
FIG. 3A through FIG. 3E show plots of resistance as a function of the applied magnetic field for the sensor of FIG. 1 with different sensing layer thicknesses.
Figure 3B:
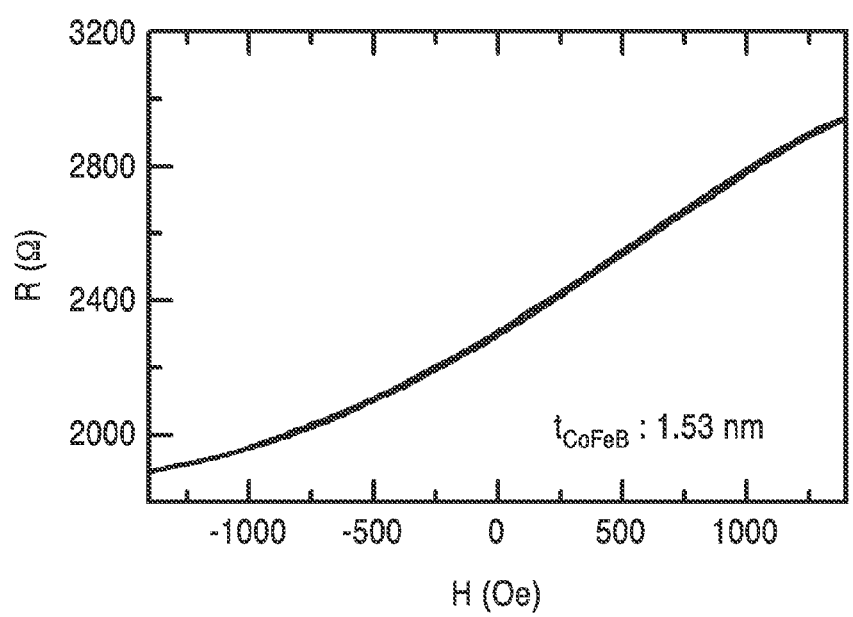
Figure 3C:
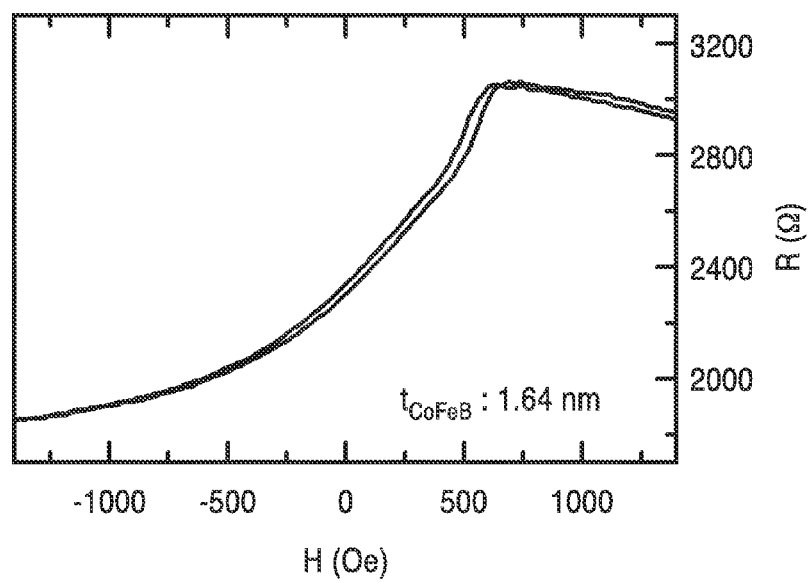
Figure 3D:
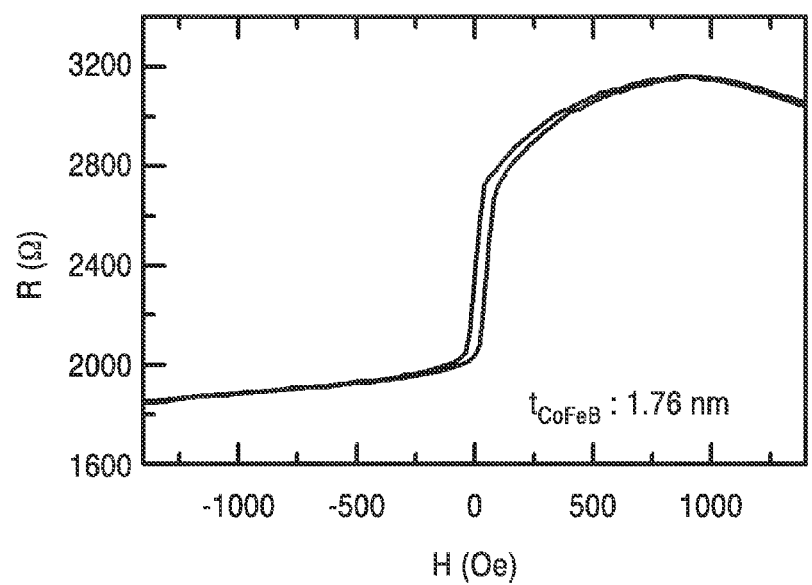
Figure 3E:
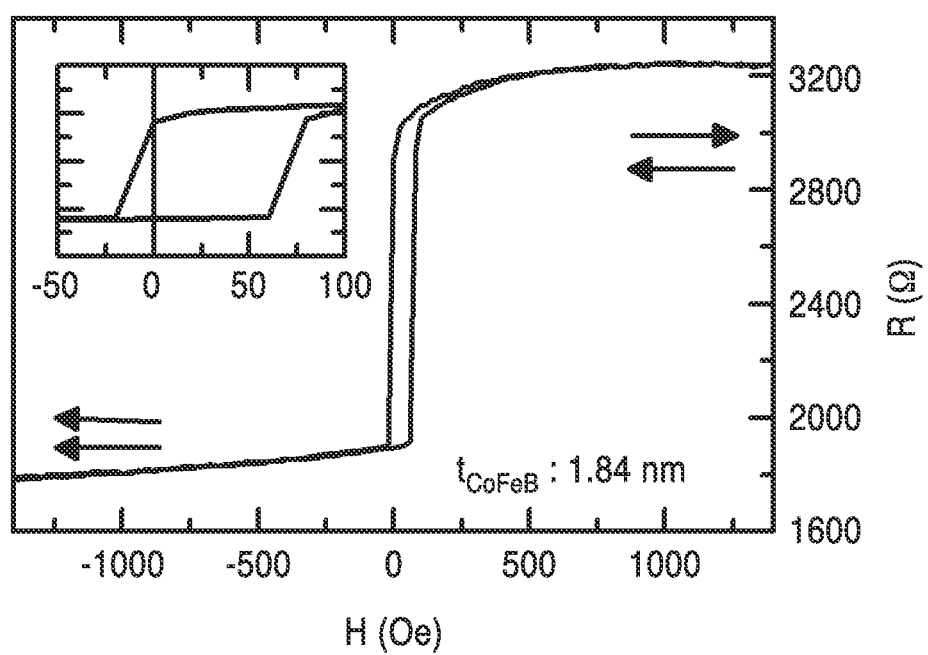

It is also appreciated that other layer configurations from those depicted in FIG. 1 and FIG. 2 are contemplated. For example, dielectric or MgO layer may be positioned above sensing layer 12. Furthermore, the device 10 may be fabricated in reverse order, with sensing layer 12 at the bottom and anti-ferromagnetic layer 22 at the top.

Layer configuration 10 provides better scalability, a simple structure and high sensitivity. Furthermore, the tunability of the perpendicular anisotropy of the CoFeB sensing layer 12 by adjusting its thickness allows one to easily design various magnetic sensors for specific applications.

Referring to the layer configuration 50 of FIG. 2, the free layer 12 may be additionally capped (or seeded) by an appropriate metal or dielectric layer 24 that may serve both as part of a measurement contact, as well as to promote the perpendicular anisotropy or voltage control of anisotropy. In one embodiment, layer 24 may comprise a metal such as Ta, Ru, Hf, Pt, Pd, or the like material. In an alternative embodiment, layer 24 may comprise an oxide layer, comprising e.g. MgO, TaOx, HfOx, or the like material.

Referring to the layer configurations 10 of FIG. 1 and 50 of FIG. 2, in both cases the perpendicular anisotropy of the CoFeB sensing layer 12 may be tuned by application of a voltage (i.e. electric field) across the dielectric barrier 14, allowing one to tune the magnetic sensor properties using an applied voltage.

Experimental Results

The magnetic multilayers were deposited on a Si/SiO$_2$ substrate (not shown) in a physical vapor deposition (PVD) system. The completed stack was annealed for 2 hours at 300° C. in 1 T. Electron-beam lithography and ion milling were used to define and etch the MTJ layers resulting in circular nanopillars with nominal diameters of 60 nm, 80 nm, and 100 nm. The experimental results for the devices with the different diameters show similar behavior and all data shown below are for 80 nm circular nanopillars. The magneto-transport measurements were performed by a G-S-G probe at room temperature.

FIG. 3A through FIG. 3E show plots of the resistance as a function of applied magnetic field by varying the sensing (free) layer 12 thickness ($t_{CoFeB}$). For a device with $t_{CoFeB}$=1.84 nm (shown in FIG. 3E), normal magnetoresistance (MR) behavior was observed with MR ratio of 82% [MR=($R_{AP}$−$R_P$)/$R_P$, where $R_{AP}$ and $R_P$ are the resistances for an antiparallel and parallel magnetization configuration, respectively.] This suggests that the magnetization (i.e. magnetic moment) direction 30 of the CoFeB sensing layer 12 is in the plane of the films. The slight shift in the MR curve is presumably due to the dipolar coupling, as well as orange peel coupling, between the reference and the sensing layers (this can be eliminated by choosing a compensated synthetic antiferromagnet for layers 16, 18, and 20).

With decreasing sensing layer 12 thickness ($t_{CoFeB}$), the out-of-plane magnetization component of the sensing layer 12 continues to increase, and for $t_{CoFeB}$=1.64 nm (shown in FIG. 3C), the linear response around zero field with hysteretic behavior is presented, indicating that the CoFeB sensing layer 12 exhibits a transition from in-plane magnetization to out-of-plane magnetization in zero-applied magnetic field.

Further decreasing the thickness of the CoFeB sensing layer 12 to $t_{CoFeB}$=1.53 nm (shown in FIG. 3B), the sensor response becomes linear and hysteresis-free around zero-applied field, indicating a stable single domain perpendicular state.

At $t_{CoFeB}$=1.36 nm (shown in FIG. 3A), the linearity extends to a large applied field of more than 1000 Oe. The CoFeB sensing layer 12 thickness dependence of the MR loops correlates to perpendicular anisotropy (magnetic moment 30) at the sensing layer 12 (CoFeB)/dielectric oxide layer 14 (MgO) interface, which has been confirmed by vibrating sample magnetometry (VSM) measurement.

Figure 4A:
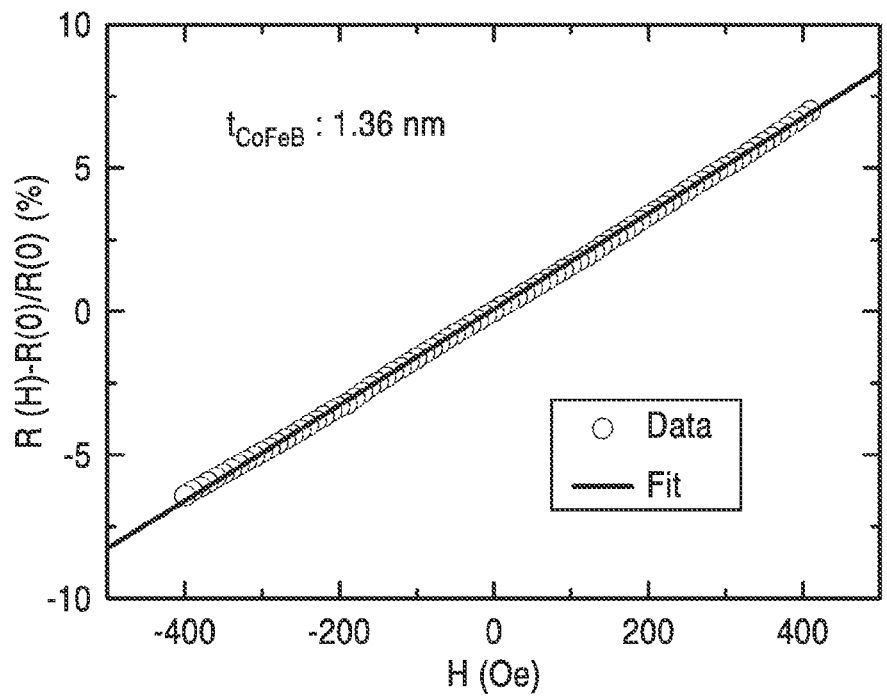
FIG. 4A shows a plot of the resistance as a function of applied magnetic field curve for a sensor with a CoFeB sensing layer of $t_{CoFeB}$=1.36 nm in the low magnetic field regime.

FIG. 4A shows the MR ratio as a function of the applied magnetic field for a sensor with sensing layer 12 thickness ($t_{CoFeB}$)=1.36 nm in a range of fields of −400 Oe≤H≤400 Oe, which indicates that the magnetic field sensitivity is 0.017% MR/Oe. This value is significantly larger than that (0.0018% MR/Oe) previously reported for a sensor utilizing an out-of-plane magnetized sensing layer because of the significantly enhanced MR ratio in the case of the sensor 10 of the technology described herein.

Figure 4B:
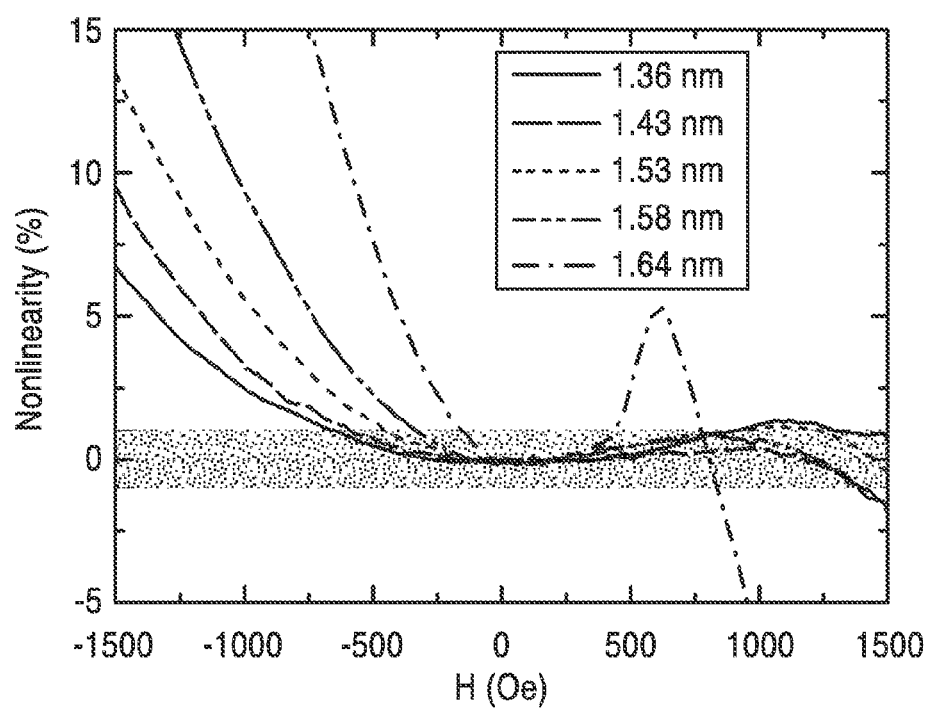
FIG. 4B shows the nonlinearity in the magnetoresistance for different CoFeB sensing layer thicknesses. The light gray box in FIG. 4B illustrates the range where nonlinearity is less than 1%.
Figure 5A:
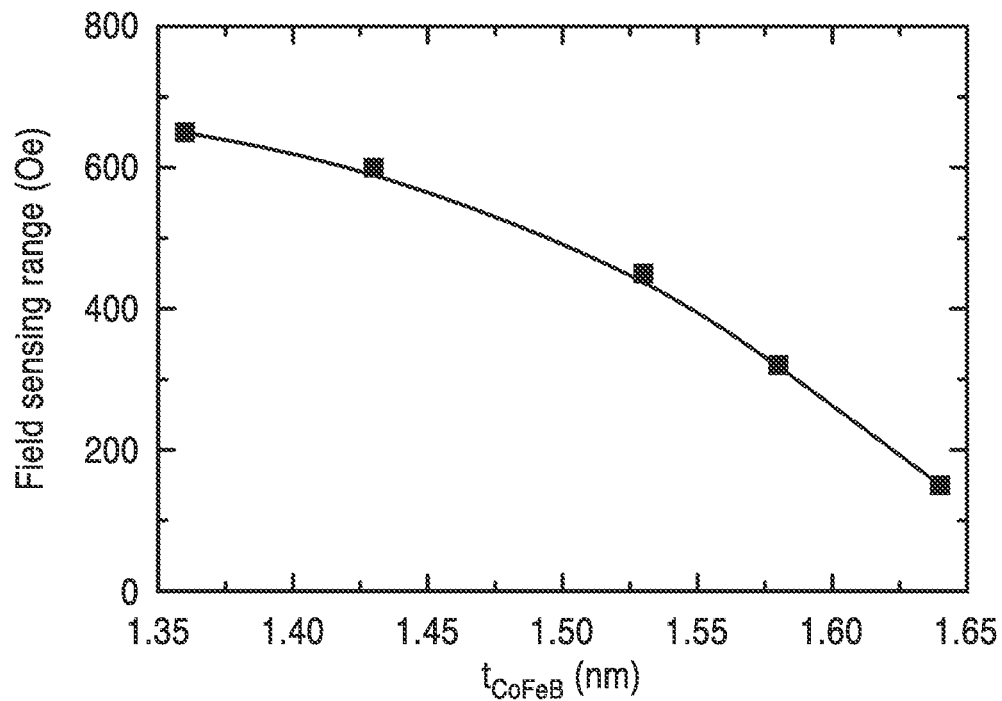
FIG. 5A and FIG. 5B show plots of the field sensing range and sensitivity, respectively, as a function of the CoFeB sensing layer thickness.
Figure 5B:
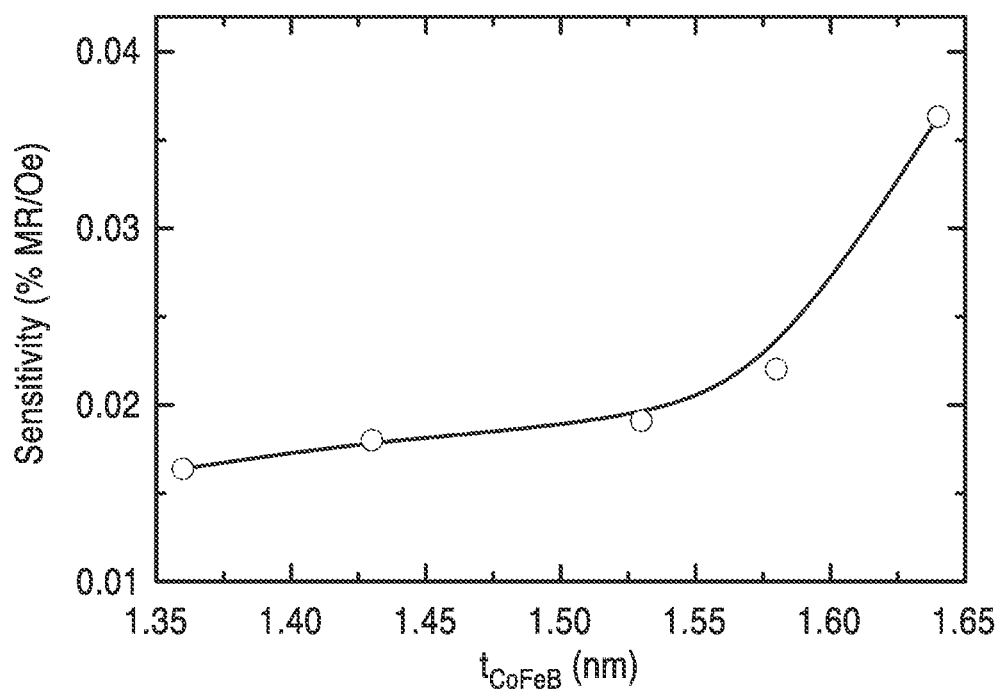

The nonlinearity, defined as 100×[R(H)−$R_0$−$r_0$H]/R(H), is plotted in FIG. 4B, where $R_0$ and $r_0$ are coefficients obtained from linear regression of R(H) as a function of the applied magnetic field H. The nonlinearity depends strongly on the CoFeB sensing layer 12 thickness. To better understand the $t_{CoFeB}$ dependence of the field sensitivity and field sensing range, the data corresponding to the nonlinearity of smaller than 1% were chosen for quantitative analysis. The linear field range increases while the field sensitivity decreases with decreasing $t_{CoFeB}$, as shown in FIG. 5A.

For $t_{CoFeB}$=1.64 nm, the field sensitivity is up to 0.036% MR/Oe, but the linear field range is limited to 150 Oe. This is, however, larger than the range reported for sensors (0.0047% MR/Oe) with super-paramagnetic CoFeB layer with a similar field range. When the CoFeB sensing layer 12 thickness is less than 1.53 nm, the field sensitivity only shows a small reduction (from 0.019% MR/Oe at 1.53 nm to 0.0165% MR/Oe at 1.36 nm).

The linear field range substantially increases from 450 to 650 Oe as the CoFeB sensing layer 12 decreases from 1.53 to 1.36 nm. This changed trend is similar to that reported in the art for spin valve sensors with out-of-plane Pt/CoFe sensing layer, but a higher field sensitivity can be obtained in the sensors according to this technology, due to the larger MR effect with MgO barrier 14 and high spin polarization CoFeB layer 12.

The following discussion details the underlying mechanisms of the free layer 12 thickness ($t_{CoFeB}$) dependence of the field sensitivity and nonlinearity. For the sensor of the technology described herein, where the magnetization of the sensing free layer 12 is expected to coherently rotate toward the film plane, the resulting change in the sensor resistance is expressed as:

$$\frac{R(H) - R(0)}{R(0)} = \qquad \text{Eqn. 1}$$

$$\frac{R_P - R_{AP}}{R_{AP} + R_P} \sin\left(\tan^{-1}\left(\frac{H}{H_k}\right)\right) = \frac{1}{1 + \frac{2}{MR}} \sin\left(\tan^{-1}\left(\frac{H}{H_k}\right)\right).$$

where $H_K$=2K/$\mu_0 M_s$, K=$K_i$/$t_{CoFeB}$−$M_s^2$/$\mu_0$, $\mu_0$ is permeability in free space, $M_s$ is the saturation magnetization, and $K_i$ is the interfacial anisotropy. Thus for small rotation angles, the field sensitivity can be expressed as:

$$S = \frac{1}{R(0)} \frac{dR}{dH} = \frac{R_{AP} - R_P}{R_{AP} + R_P} \frac{1}{H_k} = \frac{1}{1 + \frac{2}{MR}} \frac{1}{H_k}. \qquad \text{Eqn. 2}$$

From Eqn. 2 the field sensitivity is dependent on the MR ratio and $H_k$. However, for the sensor configuration 10 of the technology described herein, the MR ratio does not change significantly, while $H_k$ increases strongly as the CoFeB sensing layer thickness is reduced. Therefore, $H_k$ is dominant in the $t_{CoFeB}$ dependence of the field sensitivity, as shown in the FIG. 4B. As for nonlinearity, it can be seen from Eqn. 1 that the nonlinearity increases as the external magnetic field and MR increase, while it decreases as $H_k$ increases, i.e., the nonlinearity decreases with the decrease of $t_{CoFeB}$ as shown in FIG. 4B.

Optimizing the field sensitivity, field sensing range, linearity and reversibility (i.e. critical parameters for magnetic field sensors), our results show that, the devices with $t_{CoFeB} \leq 1.60$ nm are promising for magnetic field sensors. In addition, the ability of tuning the sensor performance by changing the sensing layer thickness and applying voltages across the device presents a powerful method to design magnetic sensors for specific applications.

It should be appreciated that detailed values of MR, interfacial anisotropy, and its thickness and voltage dependence vary greatly with the deposition and annealing conditions of the films. Hence, the specific numbers in this description are given for illustration and should not be understood to limit the scope of this technology.

In summary, nano-scale MTJ sensors were fabricated with an in-plane magnetized reference layer and a perpendicular anisotropy sensing layer and the effect of thickness of the sensing layer on the magnetic sensor performance was systematically investigated. A sensitivity value of around 0.02% MR/Oe in the nano-scale MTJ was obtained with a sensing layer thickness smaller than 1.60 nm.

Furthermore, the field sensing range can be controlled merely by changing the thickness of the CoFeB sensing layer 12, or by application of a voltage across the device (more precisely across the dielectric barrier 14), which allows the MTJs to be designed for various magnetic field sensors. In addition, the nano-scale size and simple structure of the sensors of the technology described herein make them easy to integrate with complementary metal-oxide-semiconductor technology for nano-scale low-power-consumption sensors.

From the discussion above it will be appreciated that the technology described herein can be embodied in various ways, including the following:

1. A magneto-resistance (MR) sensor, comprising: an in-plane magnetized reference layer; and a free sensing layer comprising interfacial perpendicular anisotropy.

2. A sensor as in any of the previous embodiments, wherein the sensing layer is tunable to vary the direction of the sensing layer magnetization.

3. A sensor as in any of the previous embodiments, wherein the magnetization direction is tunable to be in-plane, canted, or out-of-plane to modify sensor sensitivity and linearity.

4. A sensor as in any of the previous embodiments, wherein the interfacial anisotropy of the sensing layer may be tuned by varying the thickness of the sensing layer.

5. A sensor as in any of the previous embodiments, wherein the thickness of the sensing layer ranges from approximately 1.30 nm to 1.85 nm.

6. A sensor as in any of the previous embodiments, wherein the interfacial anisotropy of the sensing layer is configured to be tuned by application of a bias voltage to the sensor.

7. A sensor as in any of the previous embodiments, wherein the reference layer comprises a synthetic anti-ferromagnetic layer.

8. A sensor as in any of the previous embodiments, wherein the reference layer comprises a Co-rich layer.

9. A sensor as in any of the previous embodiments, wherein the reference layer comprises CoFeB.

10. A sensor as in any of the previous embodiments, wherein the sensing layer comprises an Fe-rich metallic film.

11. A sensor as in any of the previous embodiments, wherein the sensing layer comprises CoFeB.

12. A sensor as in any of the previous embodiments, wherein the sensing layer and reference layer are separated by a dielectric barrier.

13. A sensor as in any of the previous embodiments, wherein the dielectric barrier comprises MgO.

14. A sensor as in any of the previous embodiments, wherein the dielectric barrier has a thickness greater than 1 nm to form a high resistance tunnel structure.

15. A sensor as in any of the previous embodiments, wherein the free layer is capped by a metal layer to promote the perpendicular anisotropy or the voltage control of perpendicular anisotropy.

16. A sensor as in any of the previous embodiments, wherein the sensor consists of a device comprising a spin valve or magnetic tunnel junction.

17. A nanoscale linear magneto-resistance (MR) structure, comprising: an in-plane magnetized reference layer; a free layer comprising interfacial perpendicular anisotropy; and a dielectric barrier separating the sensing layer and reference layer; wherein the free layer comprises a sensing layer for sensing resistance as a function of applied magnetic field; and wherein the sensing layer is tunable to vary the direction of the sensing layer magnetization.

18. A structure as in any of the previous embodiments, wherein the magnetization direction is tunable to be in-plane, canted, or out-of-plane to modify the sensitivity and linearity of the structure.

19. A structure as in any of the previous embodiments, wherein the interfacial anisotropy of the sensing layer may be tuned by varying the thickness of the sensing layer.

20. A structure as in any of the previous embodiments, wherein the thickness of the sensing layer ranges from approximately 1.30 nm to 1.85 nm.

21. A structure as in any of the previous embodiments, wherein the interfacial anisotropy of the sensing layer is configured to be tuned by application of a DC bias voltage to the structure.

22. A structure as in any of the previous embodiments, wherein the reference layer comprises a synthetic anti-ferromagnetic layer.

23. A structure as in any of the previous embodiments, wherein the reference layer comprises Co-rich layer.

24. A structure as in any of the previous embodiments, wherein the reference layer comprises $Co_{60}Fe_{20}B_{20}$.

25. A structure as in any of the previous embodiments, wherein the sensing layer comprises an Fe-rich metallic film.

26. A structure as in any of the previous embodiments, wherein the sensing layer comprises $Co_{20}Fe_{60}B_{20}$.

27. A structure as in any of the previous embodiments, wherein the dielectric barrier comprises MgO.

28. A structure as in any of the previous embodiments, wherein the dielectric barrier has a thickness greater than 1 nm to form a high resistance tunnel structure.

29. A structure as in any of the previous embodiments, wherein the free layer is capped by a metal layer to promote the perpendicular anisotropy or voltage control of perpendicular anisotropy.

30. A structure as in any of the previous embodiments, wherein the structure consists of a sensor for use with a device comprising a spin valve or magnetic tunnel junction.

31. A nanoscale tunnel magneto-resistance (TMR) sensor, comprising: an in-plane-magnetized, Co-rich reference layer; an Fe-rich free layer comprising interfacial perpendicular anisotropy; and a dielectric barrier separating the sensing layer and reference layer; wherein the free layer comprises a sensing layer for sensing resistance as a function of applied magnetic field; and wherein the sensing layer is tunable to vary the direction of the sensing layer magnetization to be in-plane, canted, or out-of-plane.

32. A sensor as in any of the previous embodiments, wherein the interfacial anisotropy of the sensing layer may be tuned by varying the thickness of the sensing layer.

33. A sensor as in any of the previous embodiments, wherein the thickness of the sensing layer ranges from approximately 1.30 nm to 1.85 nm.

34. A sensor as in any of the previous embodiments, wherein the interfacial anisotropy of the sensing layer is configured to be tuned by application of a bias voltage to the structure.

35. A sensor as in any of the previous embodiments, wherein the dielectric barrier comprises a dielectric oxide.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A magneto-resistance (MR) sensor, comprising:
    an in-plane magnetized reference layer; and
    a sensing layer comprising a film plane, the sensing layer having interfacial anisotropy comprising a magnetization direction out of plane with respect to the film plane;
    wherein the sensing layer and reference layer are separated by a dielectric barrier;
    wherein the sensing layer is tunable to vary the direction of the sensing layer magnetization to be canted or perpendicular out of plane to the film plane to modify sensor sensitivity and linearity; and
    wherein the interfacial anisotropy of the sensing layer is configured to be tuned by varying the thickness of the sensing layer and application of a voltage applied across the dielectric barrier.

2. A sensor as recited in claim 1, wherein the magnetization direction is normal to the film plane to comprise a sensor with interfacial perpendicular anisotropy.

3. A sensor as recited in claim 2, wherein the sensing layer is capped by a metal layer to promote the perpendicular anisotropy or the voltage control of perpendicular anisotropy.

4. A sensor as recited in claim 1, wherein the thickness of the sensing layer ranges from approximately 1.30 nm to 1.85 nm.

5. A sensor as recited in claim 1, wherein the reference layer comprises a synthetic anti-ferromagnetic layer.

6. A sensor as recited in claim 1, wherein the reference layer comprises a Co-rich layer.

7. A sensor as recited in claim 6, wherein the reference layer comprises $Co_{60}Fe_{20}B_{20}$.

8. A sensor as recited in claim 1, wherein the sensing layer comprises an Fe-rich metallic film.

9. A sensor as recited in claim 8, wherein the sensing layer comprises $Co_{20}Fe_{60}B_{20}$.

10. A sensor as recited in claim 1, wherein the dielectric barrier comprises MgO.

11. A sensor as recited in claim 1, wherein the dielectric barrier has a thickness greater than 1 nm to form a high resistance tunnel structure.

12. A sensor as recited in claim 1, wherein the sensor consists of a device comprising a spin valve or magnetic tunnel junction.

13. A nanoscale linear magneto-resistance (MR) structure, comprising:
    an in-plane magnetized reference layer;
    a free layer;
    wherein the free layer comprises a sensing layer for sensing resistance as a function of applied magnetic field;
    the sensing layer comprising a film plane and a magnetization direction out of plane with respect to the film plane; and
    a dielectric barrier separating the sensing layer and reference layer;
    wherein the sensing layer is configured to be tuned to vary the direction of the sensing layer magnetization to be canted or perpendicular out of plane to the film plane to modify sensor sensitivity and linearity by application of a voltage applied across the dielectric barrier.

14. A structure as recited in claim 13, wherein the magnetization direction is normal to the film plane to comprise a sensor with interfacial perpendicular anisotropy.

15. A structure as recited in claim 14, wherein the free layer is capped by a metal layer to promote the perpendicular anisotropy or voltage control of perpendicular anisotropy.

16. A structure as recited in claim 14, wherein the interfacial anisotropy of the sensing layer is configured to be tuned by varying the thickness of the sensing layer.

17. A structure as recited in claim 16, wherein the thickness of the sensing layer ranges from approximately 1.30 nm to 1.85 nm.

18. A structure as recited in claim 13, wherein the reference layer comprises a synthetic anti-ferromagnetic layer.

19. A structure as recited in claim 18, wherein the reference layer comprises a Co-rich layer.

20. A structure as recited in claim 19, wherein the reference layer comprises $Co_{60}Fe_{20}B_{20}$.

21. A structure as recited in claim 13, wherein the sensing layer comprises an Fe-rich metallic film.

22. A structure as recited in claim 21, wherein the sensing layer comprises $Co_{20}Fe_{60}B_{20}$.

23. A structure as recited in claim 13, wherein the dielectric barrier comprises MgO.

24. A structure as recited in claim 23, wherein the dielectric barrier has a thickness greater than 1 nm to form a high resistance tunnel structure.

25. A structure as recited in claim 13, wherein the structure consists of a sensor for use with a device comprising a spin valve or magnetic tunnel junction.

26. A nanoscale tunnel magneto-resistance (TMR) sensor, comprising:
    an in-plane-magnetized, Co-rich reference layer;
    an Fe-rich free layer;

wherein the free layer comprises a sensing layer for sensing resistance as a function of applied magnetic field; and the sensing layer comprising a film plane and a magnetization direction out of plane with respect to the film plane; and a dielectric barrier separating the sensing layer and reference layer;

wherein the sensing layer is configured to be tuned to vary the direction of the sensing layer magnetization to be canted or perpendicular out of plane to the film plane to modify sensor sensitivity and linearity by application of a voltage applied across the dielectric barrier.

27. A sensor as recited in claim 26, wherein magnetization of the sensing layer may be tuned by varying the thickness of the sensing layer.

28. A sensor as recited in claim 26, wherein the thickness of the sensing layer ranges from approximately 1.30 nm to 1.85 nm.

29. A sensor as recited in claim 26, wherein the dielectric barrier comprises a dielectric oxide.

* * * * *